United States Patent
Mizusaki et al.

(10) Patent No.: US 12,010,807 B2
(45) Date of Patent: Jun. 11, 2024

(54) SENSOR PROVIDED WITH PLURALITY OF CIRCUIT BOARDS

(71) Applicant: OMRON Corporation, Kyoto (JP)

(72) Inventors: Hiroyuki Mizusaki, Kyoto (JP);
Jumpei Nakamura, Kyoto (JP);
Shunya Takahashi, Kyoto (JP);
Tomonari Kawakami, Kyoto (JP)

(73) Assignee: OMRON Corporation, Kyoto (JP)

( * ) Notice: Subject to any disclaimer, the term of this patent is extended or adjusted under 35 U.S.C. 154(b) by 148 days.

(21) Appl. No.: 17/911,414

(22) PCT Filed: Mar. 8, 2021

(86) PCT No.: PCT/JP2021/008853
§ 371 (c)(1),
(2) Date: Sep. 13, 2022

(87) PCT Pub. No.: WO2021/205799
PCT Pub. Date: Oct. 14, 2021

(65) Prior Publication Data
US 2023/0180416 A1 Jun. 8, 2023

(30) Foreign Application Priority Data
Apr. 10, 2020 (JP) ................................ 2020-071193

(51) Int. Cl.
*H05K 7/14* (2006.01)
(52) U.S. Cl.
CPC ......... *H05K 7/1402* (2013.01); *H05K 7/1459* (2013.01); *H05K 7/1488* (2013.01)
(58) Field of Classification Search
None
See application file for complete search history.

(56) References Cited

U.S. PATENT DOCUMENTS

| | | | | |
|---|---|---|---|---|
| 9,955,596 | B2* | 4/2018 | Voss | H05K 3/361 |
| 2014/0118727 | A1* | 5/2014 | Murata | G01S 7/4813 |
| | | | | 356/213 |
| 2018/0259372 | A1* | 9/2018 | Komai | G01B 11/26 |

FOREIGN PATENT DOCUMENTS

| | | |
|---|---|---|
| JP | H0545667 | 6/1993 |
| JP | 2001210202 | 8/2001 |

(Continued)

OTHER PUBLICATIONS

"International Search Report (Form PCT/ISA/210) of PCT/JP2021/008853," mailed on May 25, 2021, with English translation thereof, pp. 1-5.

(Continued)

*Primary Examiner* — James Wu
*Assistant Examiner* — Christopher L Augustin
(74) *Attorney, Agent, or Firm* — JCIPRNET (57) ABSTRACT

A base member of the sensor includes a first projection part, a second projection part, and a third projection part, being columnar and projecting from a first placement surface. Tip ends of the first, second and third projection parts are formed on second placement surfaces. The first and second projection parts respectively include a fourth pin and a fifth pin inserted through a second rigid substrate and projecting from the second placement surface. Three ribs are formed on a peripheral surface of the fourth pin and disposed so that positions viewed from a center of the fourth pin respectively form angles less than 180 degrees. Two ribs are formed on a peripheral surface of the fifth pin, and project along a fourth line perpendicular to a third line connecting the fourth pin and the fifth pin.

9 Claims, 8 Drawing Sheets

(56) References Cited

FOREIGN PATENT DOCUMENTS

| | | |
|---|---|---|
| JP | 2004318061 | 11/2004 |
| JP | 2007073417 | 3/2007 |
| JP | 2016118591 | 6/2016 |
| JP | 2017157487 | 9/2017 |
| JP | 2018122800 | 8/2018 |
| JP | 2018152227 | 9/2018 |

OTHER PUBLICATIONS

"Written Opinion of the International Searching Authority (Form PCT/ISA/237) of PCT/JP2021/008853," mailed on May 25, 2021, with English translation thereof, pp. 1-8.

* cited by examiner

SENSOR PROVIDED WITH PLURALITY OF CIRCUIT BOARDS

CROSS-REFERENCE TO RELATED APPLICATION

This application is a 371 application of the International PCT application serial no. PCT/JP2021/008853, filed on Mar. 8, 2021, which claims the priority benefits of Japan Patent Application No. 2020-071193, filed on Apr. 10, 2020. The entirety of each of the above-mentioned patent applications is hereby incorporated by reference herein and made a part of this specification.

TECHNICAL FIELD

The invention relates to a sensor with multiple circuit substrates.

RELATED ART

In a housing of a sensor, such as a light sensor, a circuit substrate on which an electronic circuit realizing a sensor function is mounted, in addition to an optical component, such as a lens, is accommodated. In the configuration of a highly functional sensor capable of detecting various work pieces, the size of the circuit substrate for carrying out a complicated process is increased. Instead of increasing the size of the housing to fit the circuit substrate, the circuit substrate may be divided into a size equal to or smaller than the size that the housing is able to accommodate, and may be split into pieces to be disposed in the housing.

However, when multiple circuit substrates are disposed in parallel arrangement, the thickness of the mounting space for the circuit substrates increases. With the size of the housing staying the same, the thinner the mounting space of the circuit substrate, the larger a lens can be mounted. As a consequence, the optical properties are facilitated. In order to reduce the size and facilitate the performance of the sensor, it is desired that the mounting space of the circuit substrate be as thin as possible.

Patent Document 1 discloses a photoelectric sensor in which two circuit substrates are disposed to be perpendicular to each other, instead of being parallel. A wiring substrate, as a first circuit substrate, is disposed along a cover body forming the right side surface. An input/output mounting substrate, as a second circuit substrate, is disposed along an upper surface perpendicular to the cover body.

CITATION LIST

Patent Literature

[Patent Document 1] Japanese Laid-open No. 2007-73417

SUMMARY OF INVENTION

Technical Problem

However, since the upper surface is narrower than the right side surface, the size of the circuit substrate that can be disposed is limited. Therefore, an objective of the invention is to provide a sensor capable of accommodating multiple circuit substrates in a compact manner. Means for solving the issue A sensor according to an aspect of the disclosure includes: a base member, on which a first placement surface and a second placement surface parallel to the first placement surface are formed; a first rigid substrate, fixed to the first placement surface; and a second rigid substrate, fixed to the second placement surface. An electronic component used for sensing is mounted to straddle the first rigid substrate and the second rigid substrate. The base member includes a first projection part, a second projection part, and a third projection part, being columnar and projecting from the first placement surface. The second placement surfaces are formed at tip ends of the first projection part, the second projection part, and the third projection part. The first projection part includes a fourth pin projecting from the second placement surface to be inserted through the second rigid substrate. The second projection part includes a fifth pin projecting from the second placement surface to be inserted through the second rigid substrate. Three ribs are formed on a peripheral surface of the fourth pin. The three ribs is disposed so that positions viewed from a center of the fourth pin respectively form angles less than 180 degrees. Two ribs are formed on a peripheral surface of the fifth pin, and the two ribs project along a fourth line perpendicular to a third line connecting the fourth pin and the fifth pin.

According to the aspect, the second rigid substrate can be precisely positioned by the positioning pins having ribs formed on the peripheral surfaces. Specifically, the second placement surfaces are defined by at least three support parts. On the second placement surface, regarding the second rigid substrate, all the movements are limited by the fourth pin with three ribs whose crossing angles are less than 180 degrees, except for a rotation movement with the fourth pin as the axis. In addition, regarding the second rigid substrate, the rotation movement with the fourth pin as the axis is also limited by the fifth pin having two ribs projecting in a tangential direction of rotation. Since the first rigid substrate and the second rigid substrate can be precisely positioned through the base member without the interference of other substrates, multiple substrates can be disposed as close to the limit as possible. Since the mounting space of the substrate can be minimized, the housing can be miniaturized. The optical component can be large, and the optical properties can be facilitated.

In the above aspect, it may also be that the base member includes a first fixing part, a second fixing part, and a third fixing part fixing the first rigid substrate, the first fixing part includes a first pin projecting from the first placement surface to be inserted through the first rigid substrate, the second fixing part includes a second pin projecting from the first placement surface to be inserted through the first rigid substrate, the third fixing part includes a third pin projecting from the first placement surface to be inserted through the first rigid substrate, three ribs are formed on a peripheral surface of the first pin, the three ribs being disposed so that positions viewed from a center of the first fourth pin respectively form angles less than 180 degrees, and two ribs are formed on a peripheral surface of the second pin, and the two ribs project along a second line perpendicular to a first line connecting the first pin and the second pin.

According to the aspect, the first rigid substrate can be more precisely positioned by the positioning pins having ribs formed on the peripheral surfaces. Multiple substrates can be disposed as close to the limit as possible.

In the above aspect, it may also be that the first rigid substrate and the second rigid substrate are portions of a same rigid flexible substrate, and the first rigid substrate and the second rigid substrate are fixed to the base member by folding the rigid flexible substrate 180 degrees so that the second rigid substrate faces the first rigid substrate.

According to the aspect, the first rigid substrate and the second rigid substrate can be connected by adopting the rigid flexible substrate formed by the first rigid substrate and the second rigid substrate as integrally formed articles. Compared with the case where a connector is provided for each of the first rigid substrate and the second rigid substrate and the connectors are connected by a separate flexible substrate, the areas of the first rigid substrate and the second rigid substrate can be reduced by the amount that there is no connector.

In the above aspect, it may also be that the sensor further includes a light projection part and/or a light reception part, and the base member fixes the light projection part and/or the light reception part.

According to the aspect, a resin bracket fixing the light projection part and/or the light reception part can be used as the base member for positioning the first rigid substrate and the second rigid substrate. Without increasing the number of parts, the first rigid substrate and the second rigid substrate can be precisely positioned.

In the above aspect, it may also be that the sensor includes the light reception part, the second rigid substrate is located more remotely from the light reception part than the first rigid substrate, a signal circuit processing a signal from the light reception part is mounted on the first rigid substrate, and a power circuit supplying power to the electronic component is mounted on the second rigid substrate.

According to the aspect, the power circuit through which a large current flows and a delicate signal circuit are disposed in blocks. Since the second rigid substrate that generates a large amount of heat is disposed on the outer periphery part of the housing that is remote from the light reception part and easy to dissipate heat, the circuit substrate can be cooled off efficiently.

In the above aspect, it may also be that concave parts recessed from the second placement surfaces are formed on peripheries of the fourth pin and the fifth pin.

According to the aspect, at the time of positioning by inserting the pins through the second rigid substrate while compressing the ribs, the scrapped resin scraps of the ribs are not accommodated between the second placement surface and the second rigid substrate, but in a pocket of the concave part formed on the periphery of the pin. The height of the second rigid substrate can be precisely positioned on the second placement surface.

A sensor according to an aspect of the disclosure includes: a rigid flexible substrate, including a first rigid substrate and a second rigid substrate which are rigid, and folded 180 degrees so that the second rigid substrate faces the first rigid substrate; and a base member, including a bottom wall that is plate-like and a first projection part, a second projection part, and a third projection part, being columnar and projecting from the bottom wall. The first rigid substrate is fixed to a first placement surface formed on the bottom wall, and the second rigid substrate is fixed to second placement surfaces formed to straddle tip ends of the first projection part, the second projection part, and the third projection part.

According to the aspect, the rigid flexible substrate is fixed to the base member in a compact state of being folded 180 degrees. Multiple circuit substrates can be accommodated in a compact manner.

Inventive Effects

According to the invention, a sensor capable of accommodating multiple circuit substrates in a compact manner can be provided.

DESCRIPTION OF EMBODIMENTS

Figure 1:
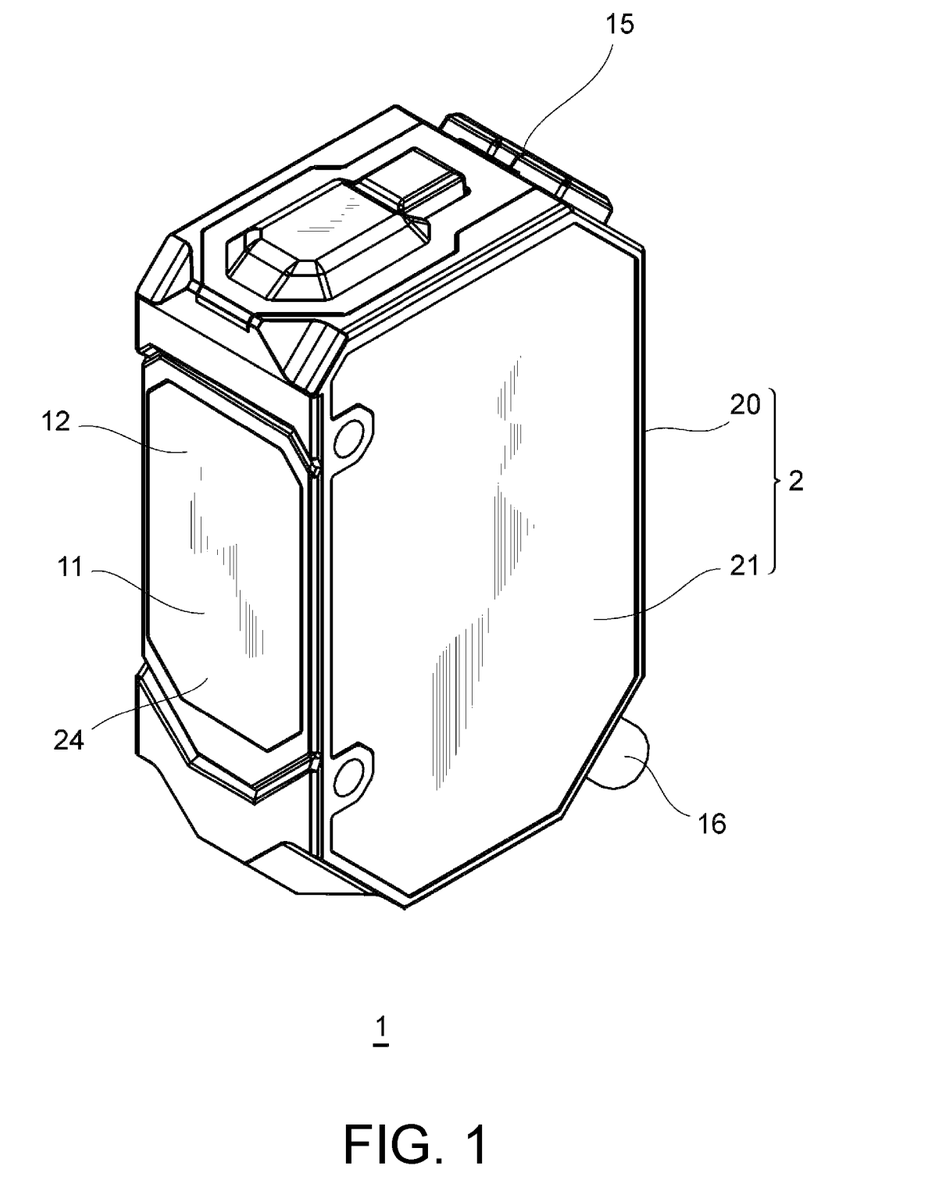
FIG. 1 is a perspective view illustrating an example of a sensor of an embodiment of the invention.
Figure 2:
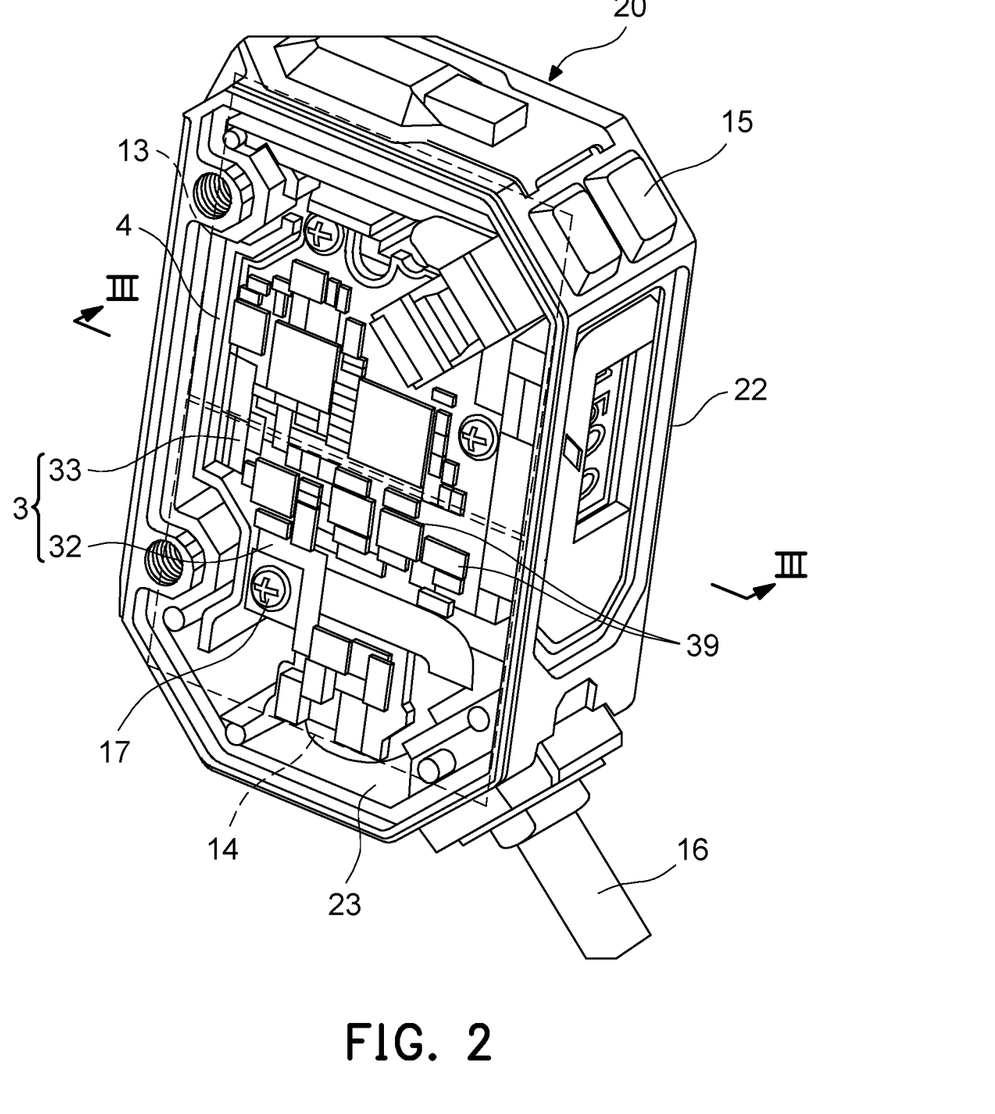
FIG. 2 is a perspective view illustrating an internal configuration of the sensor when a cover body shown in FIG. 1 is removed.

Applicable embodiments of the invention are described with reference to the drawings. In the respective drawings, those labeled with the same reference symbols have identical or similar configurations. FIG. 1 is a perspective view illustrating an example of a sensor 1 of an embodiment of the invention. FIG. 2 is a perspective view illustrating an internal configuration of the sensor 1 when a cover body 21 shown in FIG. 1 is removed.

In the example as shown, as the sensor 1, a photoelectric sensor including at least one of a light projection part emitting light and a light reception part receiving light is disclosed. The amount of light arriving at the light reception part changes when the projected light is shielded or reflected by a workpiece. The photoelectric sensor can detect such change, convert the change into an electric signal, and output the electric signal to an external apparatus.

However, the sensor 1 is not limited to a photoelectric sensor. The sensor 1 may be a displacement sensor that measures a distance from the sensor 1 to a target object by detecting a physical change amount of the target object by using an optical element and calculating the change amount as distance, an image sensor that, by performing an image process on an image obtained by a camera, calculates an area, a gravity center, a length, a location, etc., of the target object, and outputs data or a determination result, or a code reader that reads a bar code or a two-dimensional code. The sensor 1 is not limited to a light sensor, such as a photoelectric sensor, a displacement sensor, an image sensor, a code reader, etc., and may also be other sensors.

In the example as shown, the sensor 1 is configured as a diffusion-reflection type photoelectric sensor, in which a light projection part 11, a light reception part 12, a signal processing part, a control part, an output part, a power part, etc., for sensing are built therein, and is connected to an external power source and a control apparatus via a cable 16. The sensor 1 may also be configured as a transmission type or a regression-reflection type photoelectric sensor, and the light projection part 11 and the light reception part 12 may be respectively accommodated in separate housings 2, 2. The sensor 1 may also be configured as a photoelectric sensor with a built-in power source, in which an external power source supplying power to the power part is built in the housing 2.

Except for a detection surface 24 on which the light projection part 11 and the light reception part 12 are provided and an operation part 15 through which the user inputs an operation to the sensor 1, the housing 2 is formed from a metal material such as stainless steel or zinc die casting, for example. However, the material of the housing 2 is not limited to a metal material. For example, the housing 2 may also be formed from a resin material such as polybutylene terephthalate resin, ABS resin, etc. The detection surface 24, for example, is covered by a cover lens formed by, for example, a light transmissive material, such as methacrylic resin, glass, etc. An operation button and a display panel are provided on the operation part 15.

The housing 2 includes a case body 20 formed in a substantially cuboid cup shape, and a cover body 21 covering an opening of the case body 20. The case body 20 includes a bottom wall 22 and a peripheral wall 23 standing from the bottom wall 22 and extending toward the cover body 21. In the housing 2, the bottom wall 22 is located on a side opposite to the cover body 21.

Figure 3:
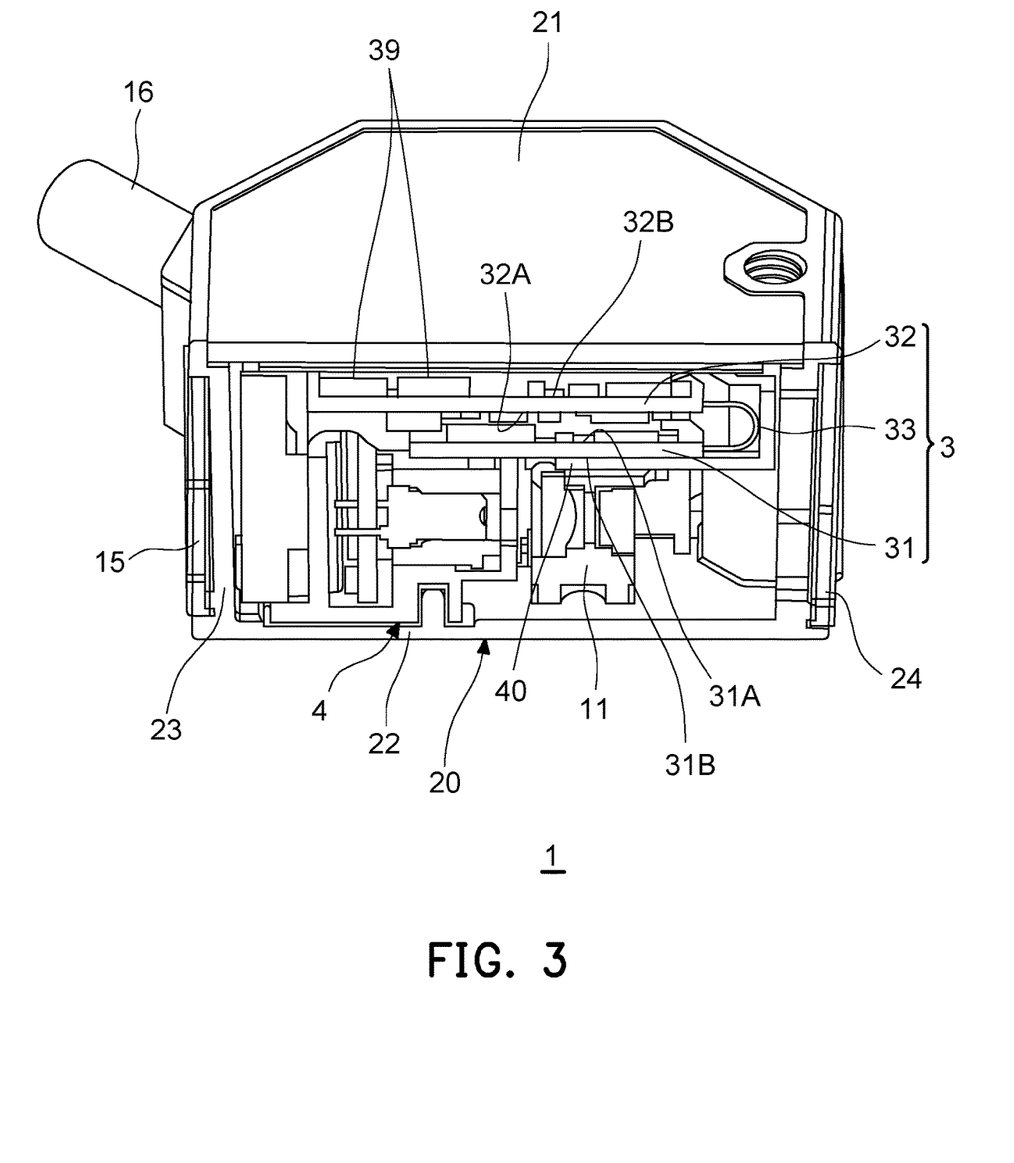
FIG. 3 is a cross-sectional view taken along a line shown in FIG. 2.

FIG. 3 is a cross-sectional view taken along a line shown in FIG. 2. In the housing 2, multiple rigid substrates 31, 32, . . . , disposed parallel to each other are accommodated.

In the example as shown, two rigid substrates 31, 32 disposed parallel to each other are accommodated in the housing 2. While not shown in the drawings, three or more rigid substrates disposed parallel to each other may also be accommodated in the housing 2. The second rigid substrate 32 is disposed along the cover body 21 of the housing 2. The first rigid substrate 31 is disposed parallel to the second rigid substrate 32.

The first rigid substrate 31 is formed in a rigid plate shape having a first surface 31A and a second surface 31B on a side opposite to the first surface 31A. Similarly, the second rigid substrate 32 is formed in a rigid plate shape having a first surface 32A and a second surface 32B on a side opposite to the first surface 31A. The adjacent rigid substrates 31 and 32 are disposed so that the first surfaces 31A and 32A face each other.

Electronic components 39 are mounted on the two surfaces 31A and 31B of the first rigid substrate 31. Similarly, electronic components 39 are mounted on the two surfaces 32A and 32B of the second rigid substrate 32. It is noted that the electronic components 39 may be mounted on only one of the first surface 31A and the second surface 31B, and the electronic components 39 may also be mounted on only one of the first surface 32A and the second surface 32B.

The electronic component 39, for example, forms the signal processing part or the power part described above. More specifically, on the first rigid substrate 31, a signal circuit 13 processing a signal from the light reception part forms the signal processing part. On the second rigid substrate 32, in addition to the signal circuit 13, a power circuit 14 supplying power received from the external power source to an electronic circuit is mounted and forms the power part.

In the example as shown, the size of the first rigid substrate 31 is smaller than the size of the second rigid substrate 32. At the portion where the second rigid substrate 32 does not face the first rigid substrate 31, a grounding member 17 (shown in FIG. 2) penetrating through the second rigid substrate 32 is provided on the second rigid substrate 32. The grounding member 17 of the second rigid substrate 32 through which a large current flows can be disposed without interference with the first rigid substrate 31. Since it is not necessary to extend a wire to bypass the first rigid substrate 31 and be connected to the grounding member 17, the mounting space of the grounding member 17 can be compact.

In the example as shown, the first rigid substrate 31 and the second rigid substrate 32 are portions of a same rigid flexible substrate 3. The rigid flexible substrate 3 further includes a flexible substrate 33 that is flexible and connects the first rigid substrate 31 and the second rigid substrate 32. In the rigid flexible substrate 3, the flexible substrate 33 is folded 180 degrees by making the flexible substrate 33 a folded part, so that the first rigid substrate 31 and the second rigid substrate 32 face each other.

The rigid flexible substrate 3 has a first surface (31A, 32A), and a second surface (31B, 32B) on the side opposite to the first surface (31A, 32A). The first surfaces 31A and 32A of the first rigid substrate 31 and the second rigid substrate 32 are defined on the first surface (31A, 32A) of the rigid flexible substrate 3. Similarly, the second surfaces 31B and 32B of the first rigid substrate 31 and the second rigid substrate 32 are defined on the second surface (31B, 32B) of the rigid flexible substrate 3.

At least one of the light projection part 11 and the light reception part 12 is accommodated in a space between the bottom wall 22 and the first rigid substrate 31. The second rigid substrate 32 is located more remotely from the light reception part 12 than the first rigid substrate 31. With the size of the housing 2 staying the same, the thinner the mounting space of the first rigid substrate 31 and the second rigid substrate 32, the larger a lens can be mounted to facilitate the optical properties of the light projection part 11 and/or the light reception part 12. The light projection part 11 and/or the light reception part 12 is fixed to the base member 4 formed from a resin material, etc.

Figure 4:
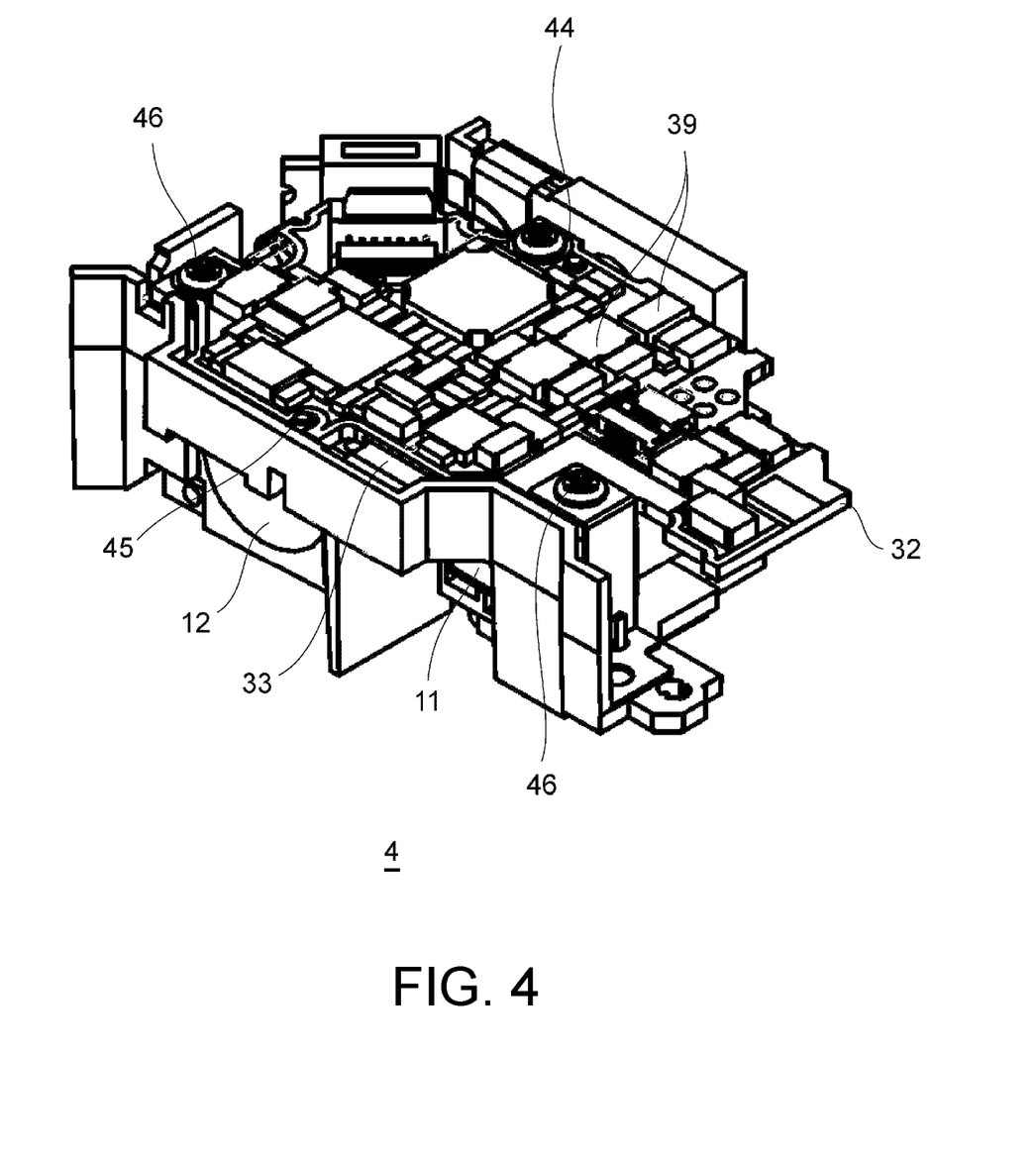
FIG. 4 is a perspective view illustrating a base member shown in FIG. 2 taken out from the housing.

FIG. 4 is a perspective view illustrating the base member 4 shown in FIG. 2 taken out from the housing 2. As shown in FIG. 4, the light projection part 11 and/or the light reception part 12, the first rigid substrate 31, and the second rigid substrate 32 are installed to base member 4. The base member 4 includes the bottom wall 40 on which a first placement surface S1 (shown in FIG. 7) is formed, and multiple bosses 44, 45, 46 (at least three, and four in the example as shown) projecting from the first placement surface S1. The second rigid substrate 32 is fixed to second placement surfaces S2 formed on the tip ends of the bosses. The bosses 44, 45, 46 serve as an example of projection parts.

The bosses 44, 45, and 46 may have a cylindrical columnar shape or a cylindrical prismatic shape, and may also be a substantially truncated cone shape or a substantially truncated pyramid shape. The projection part is not limited to a boss formed in a columnar shape or a substantially truncated shape. A tip end of a sidewall standing from the bottom wall 40 may also be configured as the projection part, and the sidewall may be formed in a stepped shape where the stepped part is formed as the projection part.

Figure 5:
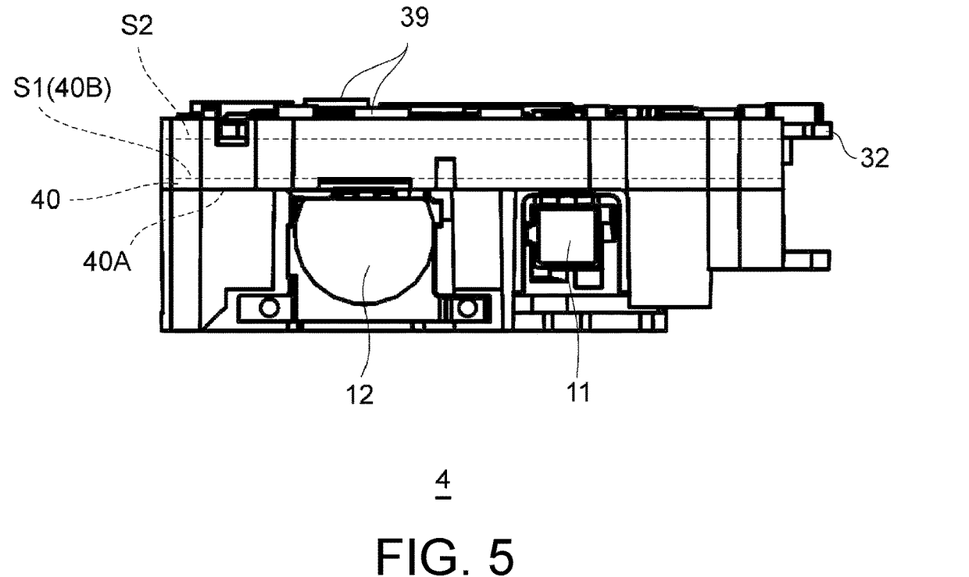
FIG. 5 is a front view illustrating a light projection part and a light reception part shown in FIG. 4.

FIG. 5 is a front view illustrating the light projection part 11 and the light reception part 12. As shown in FIG. 5, the bottom wall 40 of the base member 4 is formed in a plate shape extending along the light projection part 11 and/or the light reception part 12. The bottom wall 40 has a first surface 40A facing the light projection part 11 and/or the light reception part 12 and a second surface 40B on a side opposite to the first surface 40A. The second surface 40B is formed as the first placement surface S1 to which the first rigid substrate 31 is fixed.

Figure 6:
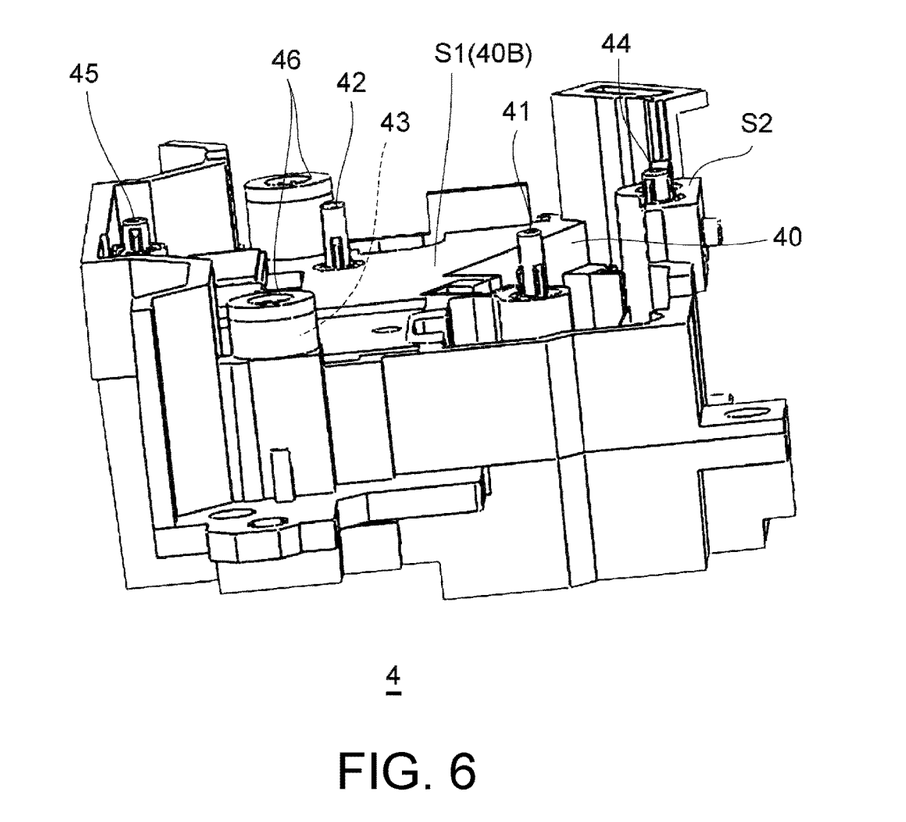
FIG. 6 is a perspective view illustrating the base member when a rigid flexible substrate, etc., is removed.

FIG. 6 is a perspective view illustrating the base member 4 when the rigid flexible substrate 3, etc., is removed. As shown in FIG. 6, the second placement surfaces S2 formed to straddle the tip ends of the bosses 44, 45, and 46 are formed in parallel with the second surface 40B of the bottom wall 40 and the first placement surface S1 on the extension thereof.

Figure 7:
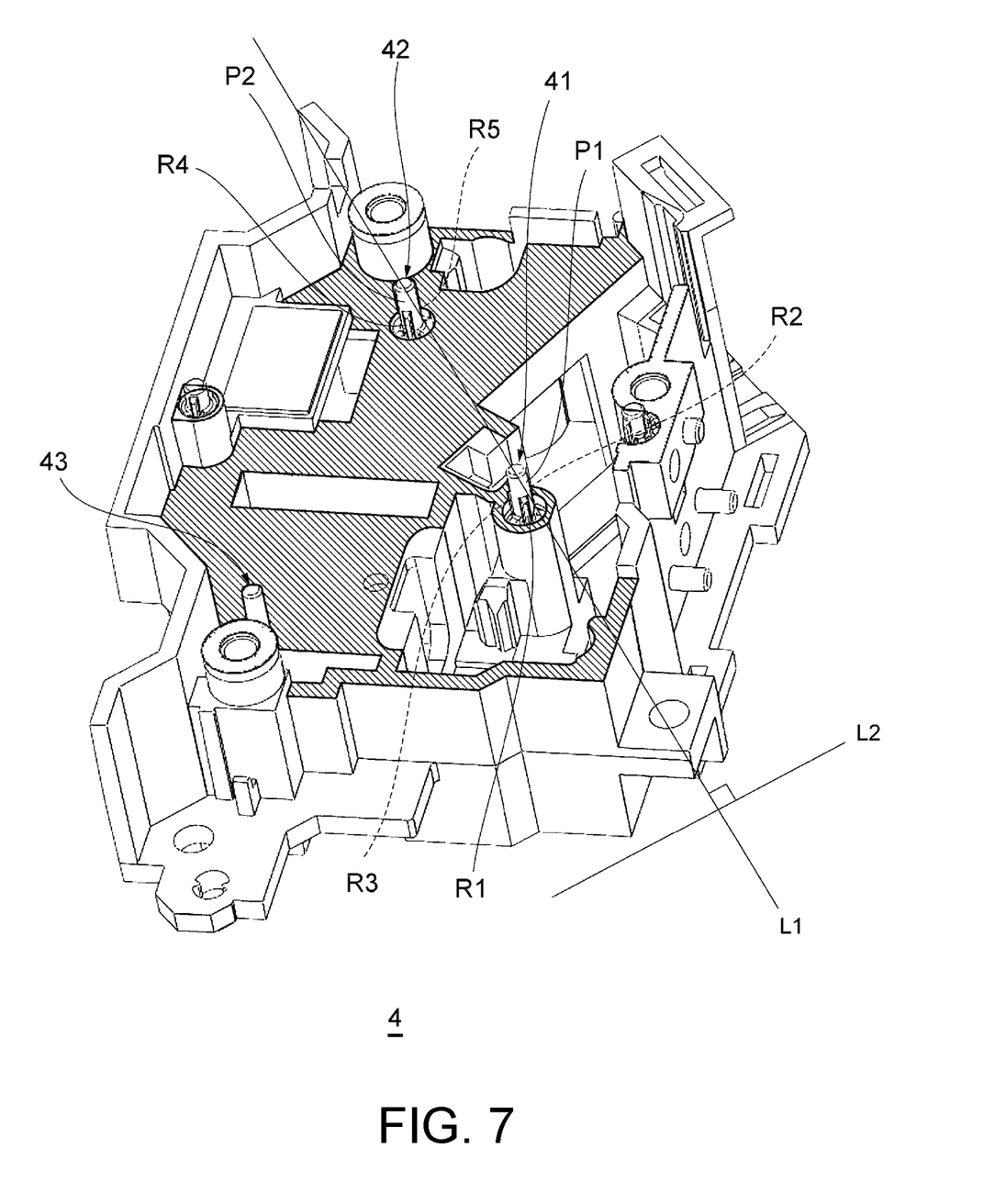
FIG. 7 is a perspective view focusing on a first placement surface shown in FIG. 6.

FIG. 7 is a perspective view focusing on the first placement surface S1 shown in FIG. 6. On the second surface 40B of the bottom wall 40 forming the first placement surface S1, multiple fixing parts fixing the first rigid substrate 31 are provided. In the example as shown, three fixing parts, i.e., a first fixing part 41, a second fixing part 42, and a third fixing part 43, are provided. The first fixing part 41 includes a first pin P1 projecting from the first placement surface S1 to be inserted through the first rigid substrate 31. Similarly, the second fixing part 42 includes a second pin P2 projecting from the first placement surface S1 to be inserted through the first rigid substrate 31. The third fixing part 43 includes a third pin P3 projecting from the first placement surface S1 to be inserted through the first rigid substrate 31.

On the peripheral surface of the first pin P1, three ribs (a first rib R1, a second rib R2, and a third rib R3) projecting in the radial direction of the first pin P1 and extending in the axial direction are formed. The three ribs R1, R2, and R3 are arranged so that the positions viewed from the center of the first pin P1 respectively form angles less than 180 degrees.

In the example as shown, the three ribs R1, R2, and R3 are formed at substantially the same interval in the peripheral direction of the first pin P1, and when viewed from the center of the first pin P1, an angle of 120 degrees is formed between the first rib R1 and the second rib R2, an angle of 120 degrees is formed between the second rib R2 and the third rib R3, an angle of 120 degrees is formed between the third rib R3 and the third rib R1.

Regarding the position relationship among the three ribs, the ribs are not required to have the same interval. When the angle formed between the first rib R1 and the second rib R2 is set as a first angle, the angle formed between the second rib R2 and the third rib R3 is set as a second angle, and the angle formed between the third rib R3 and the first rib R1 is set as a third angle, it may also be configured that, for example, the first angle is slightly less than 180 degrees, and an angle formed by combining the second angle and the third angle combined is slightly greater than 180 degrees. Each angle may be 90 degrees or more.

On the peripheral surface of the second pin P2, two ribs (a fourth rib R4 and a fifth rib R5) projecting in the radial direction of the second pin 21 and extending in the axial direction are formed. The fourth rib R4 projects along a second line L2 perpendicular to a first line L1 connecting the first pin P1 and the second pin P2. The fifth rib R5 projects on a side opposite to the fourth rib R4 along a second line L2. On the peripheral surface of the third pin P3, no rib is formed. In the case where the number of the fixing part is four or more, the number of the third pin P3 (the third fixing part 43) in which no rib is formed is increased.

Figure 8:
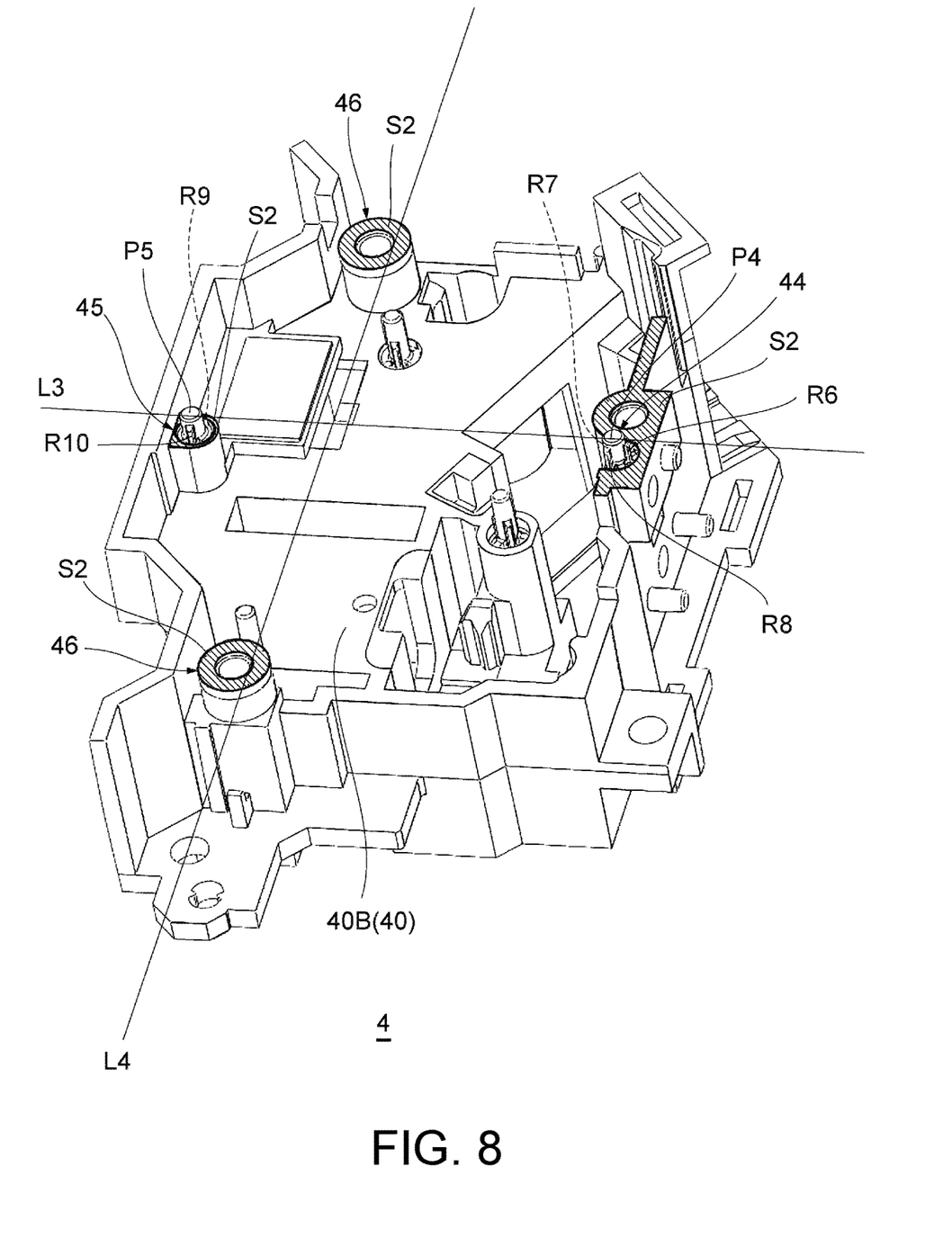
FIG. 8 is a perspective view focusing on a second placement surface shown in FIG. 6.

FIG. 8 is a perspective view focusing on the second placement surface S2 shown in FIG. 6. The base member 4 includes the first boss 44 including a fourth pin P4, the second boss 45 including a fifth pin P5, and at least one third boss 46. In the example as shown, the base member 4 includes two third bosses 46. As described above, the second placement surface S2 to which the second rigid substrate 32 is fixed is formed on the tip end of each of the bosses 44, 45, and 46. The fourth pin P4 of the first boss 44 projects from the second placement surface S2 to be inserted through the second rigid substrate 32. Similarly, the fifth pin P5 of the second boss 45 projects from the second placement surface S2 to be inserted through the second rigid substrate 32.

Like the first pin P1, on the peripheral surface of the fourth pin P4, three ribs (a sixth rib R6, a seventh rib R7, and an eighth rib R8) projecting in the radial direction of the fourth pin P4 and extending in the axial direction are formed. More specifically, the three ribs R6, R7, and R8 are arranged so that their positions viewed from the center of the fourth pin P4 respective form angles less than 180 degrees. In the example as shown, the three ribs R6, R7, and R8 are formed at substantially the same interval in the peripheral direction of the fourth pin P4, and when viewed from the center of the fourth pin P4, an angle of 120 degrees is formed between the sixth rib R6 and the seventh rib R7, an angle of 120 degrees is formed between the seventh rib R7 and the eighth rib R8, and an angle of 120 degrees is formed between the eighth rib R8 and the sixth rib R6. Regarding the position relationship among the three ribs, the ribs are not required to have the same interval.

Like the second pin P2, on the peripheral surface of the fifth pin P5, two ribs (a ninth rib R9 and a tenth rib R10) projecting in the radial direction of the fifth pin P5 and extending in the axial direction are formed. More specifically, the ninth rib R9 projects along a fourth line L4 perpendicular to a third line L3 connecting the fourth pin P4 and the fifth pin P5. The tenth rib R10 projects on a side opposite to the ninth rib R9 along the fourth line L4. In the third boss 46, a screw hole is formed in place of a pin.

In a state in which the second surface 31B of the first rigid substrate 31 contacts the first placement surface S1, if the pins P1, P2, and P3 are heated and pressurized, the first rigid substrate 31 can be fixed to the first placement surface S1 by thermal caulking. In a state in which the first surface 32A of the second rigid substrate 32 contacts the second placement surface S2, the second rigid substrate can be screwed to the third bosses 46, and if the pins P4 and P5 are subject to thermal caulking, the second rigid substrate 32 can be fixed onto the second placement surfaces S2.

Figure 9:
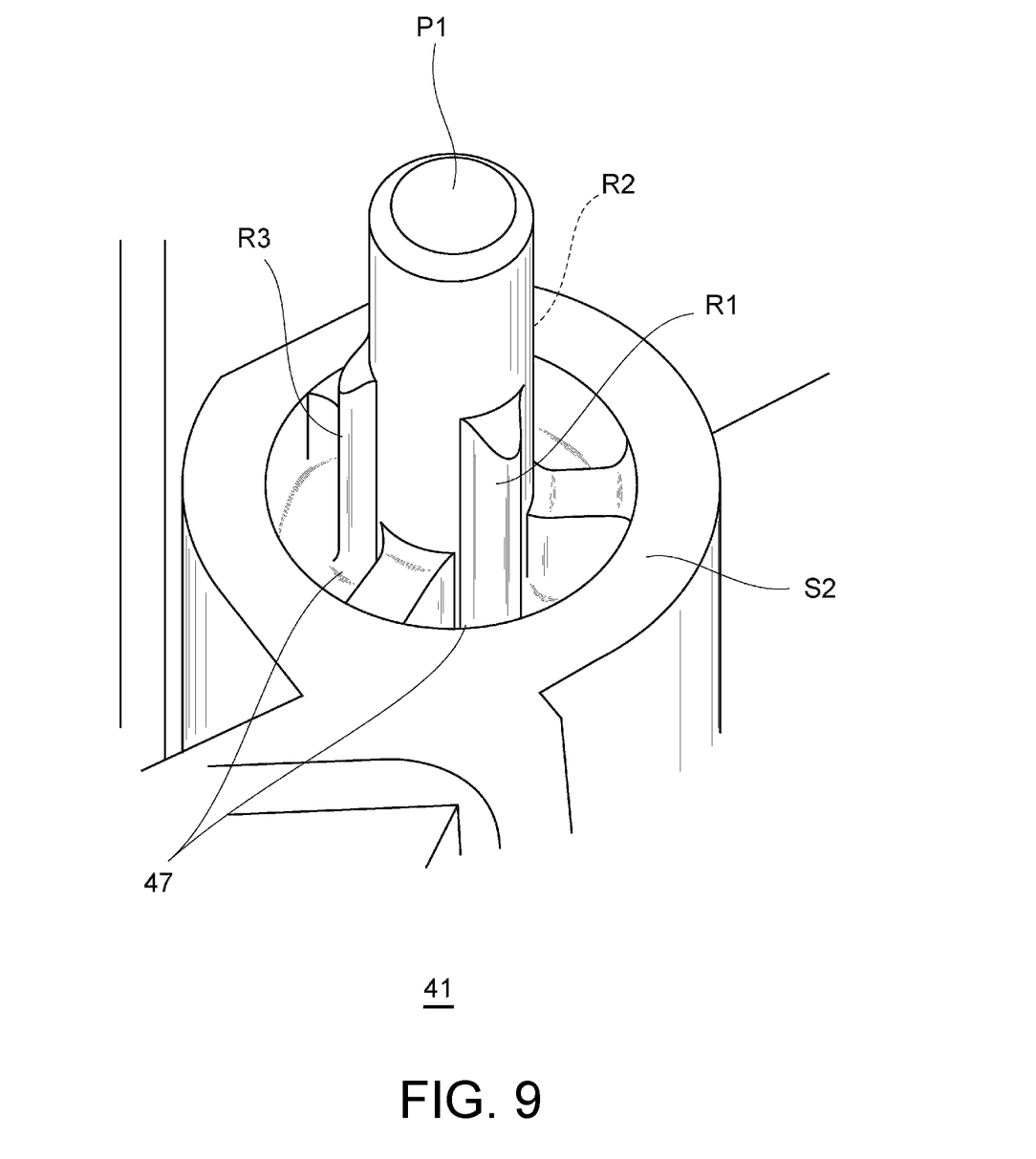
FIG. 9 is a perspective view in which a concave part of a first pin shown in FIG. 7 is enlarged.

FIG. 9 is a perspective view in which a concave part 47 of the first pin P1 shown in FIG. 7 is enlarged. As shown in FIG. 9, the concave part 47 recessed from the first placement surface S1 is formed to be adjacent to the ribs R1, R2, and R3 on the periphery of the first pin P1. Similarly, the concave part 47 recessed from the first placement surface S1 is formed to be adjacent to the ribs R4 and R5 on the periphery of the second pin P2. On the peripheries of the fourth pin P4 and the fifth pin P5, the concave parts 47 recessed from the second placement surfaces S2 are formed. It suffices as long as the concave part 47 is in adjacency with the ribs R1, R2, and R3 to the extent able to accommodate the scrapped resin scraps of the ribs.

According to the sensor 1 of the embodiment with the above configuration, the second rigid substrate 32 can be precisely positioned by the positioning pins P4 and P5 having the ribs R6, R7, R8, R9, and R10 formed on the peripheral surfaces. Since the first rigid substrate 31 and the second rigid substrate 32 can be precisely positioned through the base member 4 without the interference of other substrates, multiple substrates can be disposed as close to the limit as possible. Since the mounting space of the substrate can be minimized, the housing can be miniaturized. The optical component can be large, and the optical properties can be facilitated.

In addition to the second placement surface S2, with the positioning pins P4 and P5 formed with the ribs R1, R2, R3, R4, and R5 on the peripheral surfaces, the first rigid substrate 31 can be precisely positioned, and multiple substrates can be disposed as close to the limit as possible. Since the rigid flexible substrate 3 is fixed to the base member 4 in a compact state of being folded 180 degrees, the multiple rigid substrates 31 and 32 in the housing 2 can be accommodated in a compact manner. It is also possible to divide up the rigid flexible substrate 3 at the boundary between the first rigid substrate 31 and the second rigid substrate 32 and configure a connection by a connector, etc.

The embodiments described above are for facilitating the understanding of the invention, and are not for limiting the interpretation of the invention. Each element included in the embodiment and its arrangement, material, condition, shape, size, and the like are not limited to those exemplified, and can be appropriately changed. Further, it is possible to partially replace or combine the configurations shown in different embodiments. A part or the entirety of the embodiment may be described as in the following appendix, but the invention is not limited to the following.

APPENDIX

A sensor (1) includes: a base member (4), on which a first placement surface (S1) and a second placement surface (S2) parallel to the first placement surface are formed; a first rigid substrate (31), being rigid and fixed to the first placement surface; and a second rigid substrate (32), being rigid and fixed to the second placement surface. The base member includes: a bottom wall (40) on which the first placement surface is formed; and a first projection part (44), a second projection part (45), and a third projection part (46), being columnar and projecting from the bottom wall. The second placement surfaces are formed at tip ends of the first projection part, the second projection part, and the third projection part. The first projection part includes a fourth pin (P4) projecting from the second placement surface to be inserted through the second rigid substrate. The second projection part includes a fifth pin (P5) projecting from the second placement surface to be inserted through the second rigid substrate. Three ribs (R6, R7, R8) are formed on a peripheral surface of the fourth pin. The three ribs are disposed so that positions viewed from a center of the fourth pin respectively form angles less than 180 degrees. Two ribs (R9, R10) are formed on a peripheral surface of the fifth pin, and the two ribs project along a fourth line (L4) perpendicular to a third line (L3) connecting the fourth pin and the fifth pin.

What is claimed is:

1. A sensor, comprising:
   a base member, on which a first placement surface and a second placement surface parallel to the first placement surface are formed;
   a first rigid substrate, fixed to the first placement surface; and
   a second rigid substrate, fixed to the second placement surface,
   wherein an electronic component used for sensing is mounted to straddle the first rigid substrate and the second rigid substrate,
   the base member comprises a first projection part, a second projection part, and a third projection part, being columnar and projecting from the first placement surface,
   the second placement surfaces are formed at tip ends of the first projection part, the second projection part, and the third projection part,
   the first projection part comprises a fourth pin projecting from the second placement surface to be inserted through the second rigid substrate,
   the second projection part comprises a fifth pin projecting from the second placement surface to be inserted through the second rigid substrate,
   three ribs are formed on a peripheral surface of the fourth pin, the three ribs being disposed so that positions viewed from a center of the fourth pin respectively form angles less than 180 degrees, and
   two ribs are formed on a peripheral surface of the fifth pin, and the two ribs project along a fourth line perpendicular to a third line connecting the fourth pin and the fifth pin.

2. The sensor as claimed in claim 1, wherein the base member comprises a first fixing part, a second fixing part, and a third fixing part fixing the first rigid substrate,
   the first fixing part comprises a first pin projecting from the first placement surface to be inserted through the first rigid substrate,
   the second fixing part comprises a second pin projecting from the first placement surface to be inserted through the first rigid substrate,
   the third fixing part comprises a third pin projecting from the first placement surface to be inserted through the first rigid substrate,
   three ribs are formed on a peripheral surface of the first pin, the three ribs being disposed so that positions viewed from a center of the first pin respectively form angles less than 180 degrees, and
   two ribs are formed on a peripheral surface of the second pin, and the two ribs project along a second line perpendicular to a first line connecting the first pin and the second pin.

3. The sensor as claimed in claim 1, wherein the first rigid substrate and the second rigid substrate are portions of a same rigid flexible substrate, and
   the first rigid substrate and the second rigid substrate are fixed to the base member by folding the rigid flexible substrate 180 degrees so that the second rigid substrate faces the first rigid substrate.

4. The sensor as claimed in claim 1, further comprising:
   a light projection part and/or a light reception part,
   wherein the base member fixes the light projection part and/or the light reception part.

5. The sensor as claimed in claim 4, wherein the sensor comprises the light reception part,
   the second rigid substrate is located more remotely from the light reception part than the first rigid substrate,
   a signal circuit processing a signal from the light reception part is mounted on the first rigid substrate, and
   a power circuit supplying power to the electronic component is mounted on the second rigid substrate.

6. The sensor as claimed in claim 1, wherein concave parts recessed from the second placement surfaces are formed on peripheries of the fourth pin and the fifth pin.

7. A sensor, comprising:
   a rigid flexible substrate, comprising: a first rigid substrate and a second rigid substrate on which an electronic component used for sensing is mounted, and folded 180 degrees so that the second rigid substrate faces the first rigid substrate; and
   a base member, comprising a bottom wall that is plate-like and a first projection part, a second projection part, and a third projection part, being columnar and projecting from the bottom wall, wherein the first rigid substrate is fixed to a first placement surface formed on the bottom wall, and the second rigid substrate is fixed to second placement surfaces formed to straddle tip ends of the first projection part, the second projection part, and the third projection part.

8. The sensor as claimed in claim 7, further comprising:

a light projection part and/or a light reception part, wherein the base member fixes the light projection part and/or the light reception part.

9. The sensor as claimed in claim 8, wherein the sensor comprises the light reception part, the second rigid substrate is located more remotely from the light reception part than the first rigid substrate, a signal circuit processing a signal from the light reception part is mounted on the first rigid substrate, and a power circuit supplying power to the electronic component is mounted on the second rigid substrate.

\* \* \* \* \*